(12) United States Patent
Su et al.

(10) Patent No.: US 12,356,605 B2
(45) Date of Patent: Jul. 8, 2025

(54) MEMORY DEVICE AND MANUFACTURING METHOD THEREFOR

(71) Applicant: CHANGXIN MEMORY TECHNOLOGIES, INC., Hefei (CN)

(72) Inventors: Xingsong Su, Hefei (CN); Deyuan Xiao, Hefei (CN); Weiping Bai, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 502 days.

(21) Appl. No.: 17/882,725

(22) Filed: Aug. 8, 2022

(65) Prior Publication Data

US 2023/0309286 A1 Sep. 28, 2023

Related U.S. Application Data

(63) Continuation of application No. PCT/CN2022/086419, filed on Apr. 12, 2022.

(30) Foreign Application Priority Data

Mar. 23, 2022 (CN) .......................... 202210289745.9

(51) Int. Cl.
*H01L 27/108* (2006.01)
*H01L 21/20* (2006.01)
(Continued)

(52) U.S. Cl.
CPC ............. *H10B 12/05* (2023.02); *H01L 21/20* (2013.01); *H01L 21/3081* (2013.01);
(Continued)

(58) Field of Classification Search
CPC ........ H10B 12/05; H10B 12/30; H10B 12/03; H10D 30/6757; H10D 30/0512; H01L 21/20; H01L 21/3081
See application file for complete search history.

(56) References Cited

U.S. PATENT DOCUMENTS 9,219,005 B2 12/2015 Or-Bach
9,449,986 B1 9/2016 Yoon
(Continued)

FOREIGN PATENT DOCUMENTS

CN 109524417 A 3/2019
CN 111106122 A 5/2020
(Continued)

OTHER PUBLICATIONS

Korean Intellectual Property Office, Office Action Issued in Application No. 10-2023-7027261, Apr. 18, 2024, 15 pages.
(Continued)

*Primary Examiner* — Peniel M Gumedzoe
(74) *Attorney, Agent, or Firm* — Kilpatrick Townsend & Stockton LLP

(57) ABSTRACT

A memory device and a manufacturing method therefor. A film-stack structure is formed on a substrate, the film-stack structure includes sacrificial layers and active layers alternately stacked in a first direction. Part of the film-stack structure located in a first area is removed. A plurality of first grooves spaced apart from each other and extend in a second direction are formed, where the substrate is exposed from the first grooves to divide the active layers located in the first area into a plurality of active pillars spaced apart from each other. The sacrificial layers located in the first and second areas are removed. Part of the active layers located in the second area is removed, to form a plurality of step-shaped connection layers on an end of the second area away from the first area. Gate material layers are formed to cover the connection layers and the active pillars.

17 Claims, 14 Drawing Sheets

(51) Int. Cl.
*H01L 21/308* (2006.01)
*H01L 29/66* (2006.01)
*H01L 29/786* (2006.01)
*H10B 12/00* (2023.01)
*H10D 30/01* (2025.01)
*H10D 30/67* (2025.01)

(52) U.S. Cl.
CPC ............ *H10B 12/03* (2023.02); *H10B 12/30* (2023.02); *H10D 30/0512* (2025.01); *H10D 30/6757* (2025.01)

(56) References Cited

U.S. PATENT DOCUMENTS

| | | | |
|---|---|---|---|
| 9,620,522 B1 * | 4/2017 | Lee | H10B 43/50 |
| 10,607,995 B2 | 3/2020 | Roberts et al. | |
| 2013/0020707 A1 | 1/2013 | Or-Bach et al. | |
| 2018/0033799 A1 | 2/2018 | Kanamori | |
| 2018/0323199 A1 | 11/2018 | Roberts et al. | |
| 2019/0081069 A1 * | 3/2019 | Lu | H01L 23/5283 |
| 2021/0159229 A1 | 5/2021 | Gomes et al. | |
| 2022/0020767 A1 | 1/2022 | Lim | |
| 2022/0068859 A1 | 3/2022 | Choi et al. | |

FOREIGN PATENT DOCUMENTS

| | | |
|---|---|---|
| CN | 112466881 A | 3/2021 |
| CN | 114023703 A | 2/2022 |
| CN | 114023756 A | 2/2022 |
| EP | 3826058 A1 | 5/2021 |
| IN | 107665895 A | 2/2018 |
| KR | 20130042302 A | 4/2013 |
| KR | 20170039444 A | 4/2017 |
| KR | 20170043977 A | 4/2017 |
| KR | 20190038223 A | 4/2019 |
| KR | 20210096698 A | 8/2021 |
| TW | 202129923 A | 8/2021 |
| TW | 202143455 A | 11/2021 |
| TW | I753749 B | 1/2022 |
| TW | 202209314 A | 3/2022 |

OTHER PUBLICATIONS

Japanese Patent Office, Office Action Issued in Application No. 2023-571416, Oct. 29, 2024, 8 pages.
European Patent Office, Extended European Search Report Issued in Application No. 22932804.2, Aug. 16, 2024 Germany, 8 pages.

* cited by examiner

MEMORY DEVICE AND MANUFACTURING METHOD THEREFOR

CROSS-REFERENCE TO RELATED APPLICATIONS

This a continuation of International Application No. PCT/CN2022/086419, filed on Apr. 12, 2022, which claims priority to Chinese Patent Application No. 202210289745.9, filed to the China National Intellectual Property Administration on Mar. 23, 2022 and entitled "MEMORY DEVICE AND MANUFACTURING METHOD THEREFOR", the disclosure of the two applications is hereby incorporated by reference in their entireties.

TECHNICAL FIELD

The disclosure relates to the technical field of semiconductor, and in particular, to a memory device and a manufacturing method therefor.

BACKGROUND

With development of a semiconductor technology, memories, especially Dynamic Random Access Memories (DRAMs) are widely applied to various electronic devices as the memories have high storage density and fast read-write speed.

The DRAM usually includes a plurality of memory cells. Each memory cell includes a transistor and a capacitor. A gate electrode of the transistor is electrically connected to a Word Trine (WL) of the DRAM, and the on and off of the transistor are controlled by means of voltage on the WL. One of a source electrode and a drain electrode of the transistor is electrically connected to a Bit Line (BL), and the other one of the source electrode and the drain electrode is electrically connected to the capacitor. Data information is stored or outputted by using the BL.

In order to further decrease the size of the memory device and increase storage density, capacitors are generally horizontally placed, so as to manufacture capacitors having a larger slenderness ratio. However, it is difficult to manufacture the matched WLs.

SUMMARY

According to some embodiments, a first aspect of the disclosure provides a method for manufacturing a memory device. The method includes the following operations.

A substrate is provided.

A film-stack structure is formed on the substrate, and the film-stack structure includes sacrificial layers and active layers that are alternately stacked in a first direction.

Part of the film-stack structure located in a first area is removed, to form a plurality of first grooves that are spaced apart from each other and extend in a second direction. The substrate is exposed from the first grooves to divide the active layers located in the first area into a plurality of active pillars that are spaced apart from each other.

The sacrificial layers located in the first area and the second area are removed by using the first grooves, to cause the active pillars located in the first area and the active layers located in the second area to be spaced apart from each other in the first direction. The second area is adjacent to the first area.

Part of the active layers located in the second area are removed, to form a plurality of step-shaped connection layers on an end of the second area away from the first area.

Gate material layers are formed to cover the connection layers and the active pillars on each of a plurality of horizontal levels. On the connection layer and the active pillars located on a same one of the horizontal levels, the formed gate material layers connect with each other: and on the connection layer and the active pillars located on different ones of the horizontal levels, the formed gate material layers are isolated from each other.

According to some embodiments, a second aspect of the disclosure provides a memory device. The memory device has a first area and a second area that are adjacent to each other. The memory device includes: a plurality of connection layers, located in the second area and spaced apart from each other in a first direction, where ends of the plurality of connection layers away from the first area are in a step shape; a plurality of active pillar layers, located in the first area and spaced apart from each other in the first direction, where each of the active pillar layers is disposed at a same horizontal level with a respective one of the connection layers; each of the active pillar layers has a plurality of active pillars that are spaced apart from each other, and each of the active pillars extends in a second direction; and rate material layers, located on the connection layers and the active pillars on each of a plurality of horizontal levels, where on the connection layer and the active pillars located on a same one of the horizontal levels, the formed gate material layers connect with each other; and on the connection layer and the active pillars located on different ones of the horizontal levels, the formed gate material layers are isolated from each other.

DETAILED DESCRIPTION

In the related art, in order to further increase the storage capacity of a memory device, a capacitor is generally disposed horizontally, that is, an extending direction of the capacitor is parallel to a substrate, so as to facilitate manufacturing of the capacitor. When the capacitor is disposed horizontally, a word line (WL) matching the capacitor need to be re-arranged, so that the manufacturing difficulty of the WL is relatively lame.

In view of this, embodiments of the disclosure provide a memory device and a manufacturing method therefor. A connection layer and an active pillar are formed, and an end of the connection layer away from the active pillar is in a step shape. Gate material layers are thrilled on the connection layers and the active pillars on each of a plurality of horizontal levels. On the connection layer and the active pillars located on a same one of the horizontal levels, the formed gate material layers connect with each other; and on the connection layer and the active pillars located on different ones of the horizontal levels, the formed gate material layers are isolated from each other. The gate material layers act as WLs, so that the WLs can be manufactured and led out conveniently. The WLs are in a step shape, so that other structures are conveniently manufactured on the WLs, so as to achieve electrical connection between the WLs and a peripheral circuit.

In order to make the above purposes, features and advantages of the embodiments of the disclosure more obvious and easy to understand, the technical solutions in the embodiments of the disclosure will be clearly and completely described below with reference to the drawings in the embodiments of the disclosure. It is apparent that the embodiments described herein are only a part of the embodiments of the disclosure, rather than all of the embodiments. Based on the embodiments in the disclosure, all other embodiments obtained by those of ordinary skilled in the art without creative work shall fall within the protection scope of the disclosure.

A first aspect of an embodiment of the disclosure provides a method for manufacturing a memory device. The memory device includes a Dynamic Random Access Memory (DRAM), a Static Random Access Memory (SRAM), a flash memory, an Electrically Erasable Programmable Read-Only Memory (EEPROM), a Phase Change Random Access Memory (PRAM), or a Magneto-resistive Random Access Memory (MRAM). In this embodiment of the disclosure, the DRAM is used as an example for description.

Figure 1:
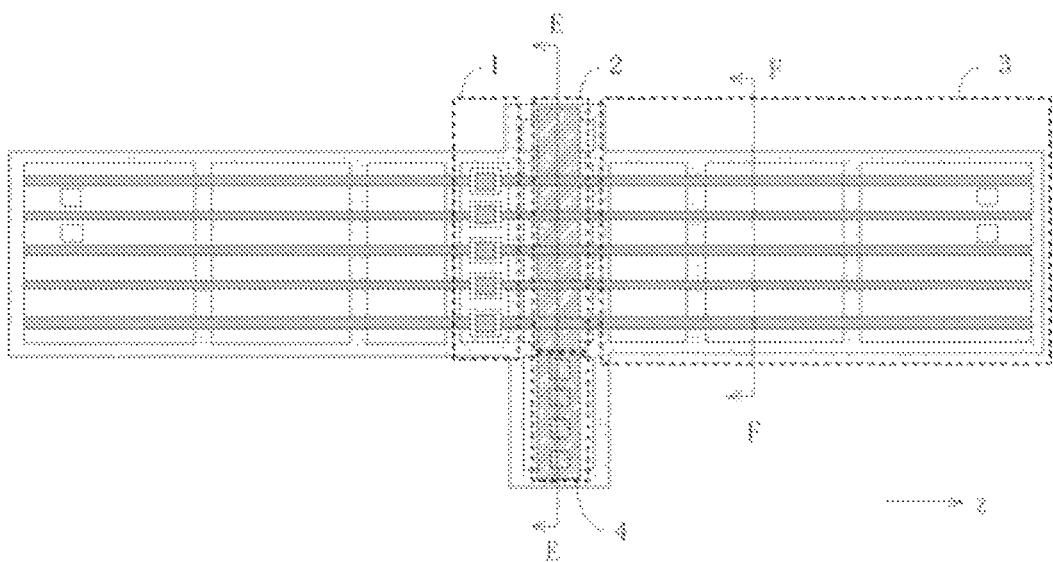
FIG. 1 is an architecture diagram of a memory device according to an embodiment of the disclosure.

Referring to FIG. 1, the memory device includes a WL 4, a Bit Line 1 (BL), a transistor 2, and a capacitor 3. A gate electrode oldie transistor 2 is electrically connected to the WL 4. One of a source electrode and a drain electrode of the transistor 2 is electrically connected to the BL 1, and the other one of the source electrode and the drain electrode is electrically connected to the capacitor 3. The WL 4 is configured to control on or off of the transistor 2. The BL 1 is configured to write data information into the capacitor 3, or read the data information in the capacitor 3. As shown in FIG. 1, the transistor 2 and the capacitor 3 extend in a second direction (a Z direction shown in FIG. 1). The direction is parallel to a substrate. That is to say, the transistor 2 and the capacitor 3 are disposed parallel to the substrate, so as to facilitate manufacturing of the capacitor 3 with a large slenderness ratio. Therefore, the storage capacity of the memory device is increased.

Figure 2:
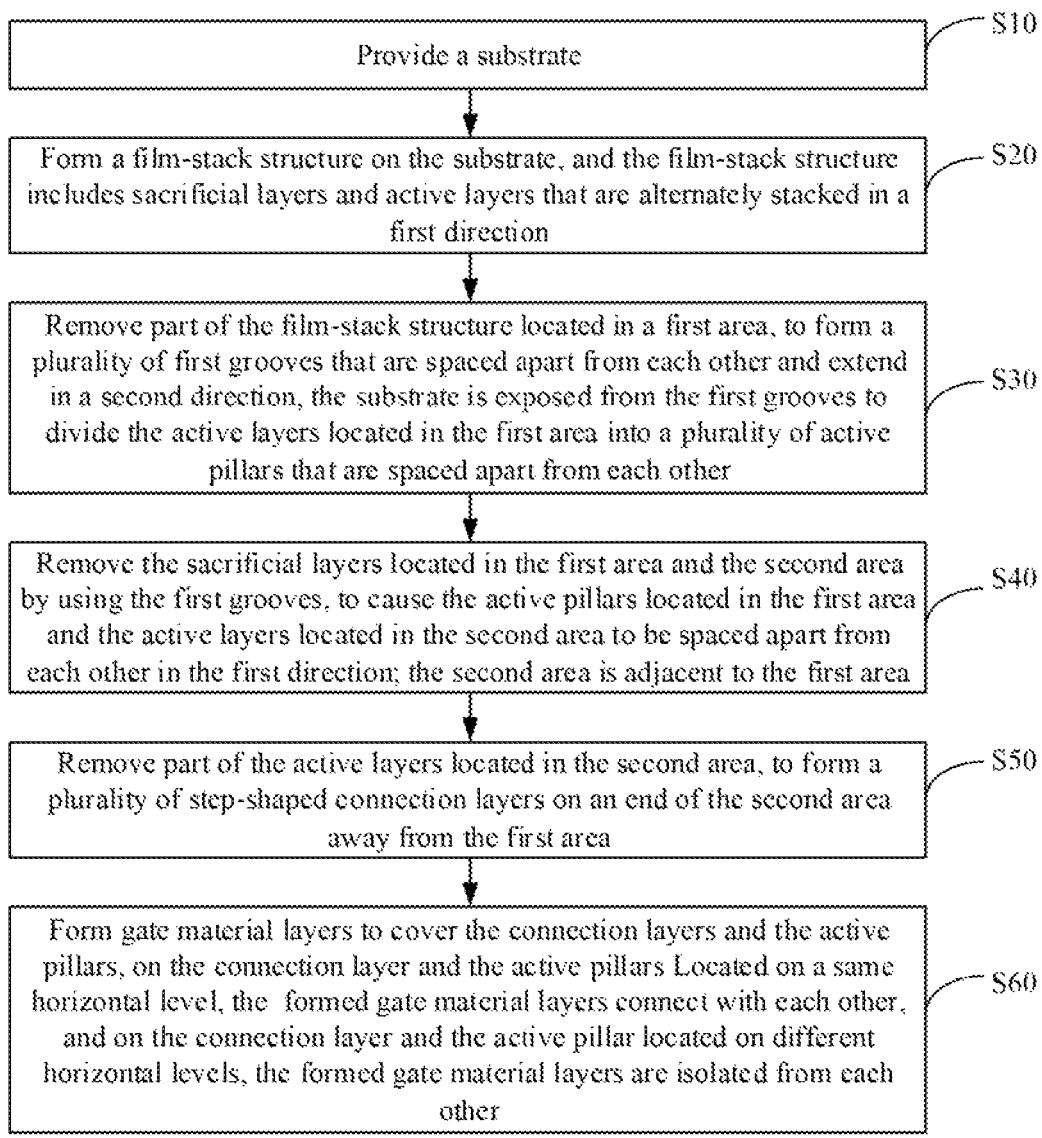
FIG. 2 is a flowchart of a method for manufacturing a memory device according to an embodiment of the disclosure.

Referring to FIG. 2, FIG. 2 is a flowchart of a method for manufacturing a memory device according to an embodiment of the disclosure. The manufacturing method may include the following steps.

At S10, a substrate is provided.

Figure 3:
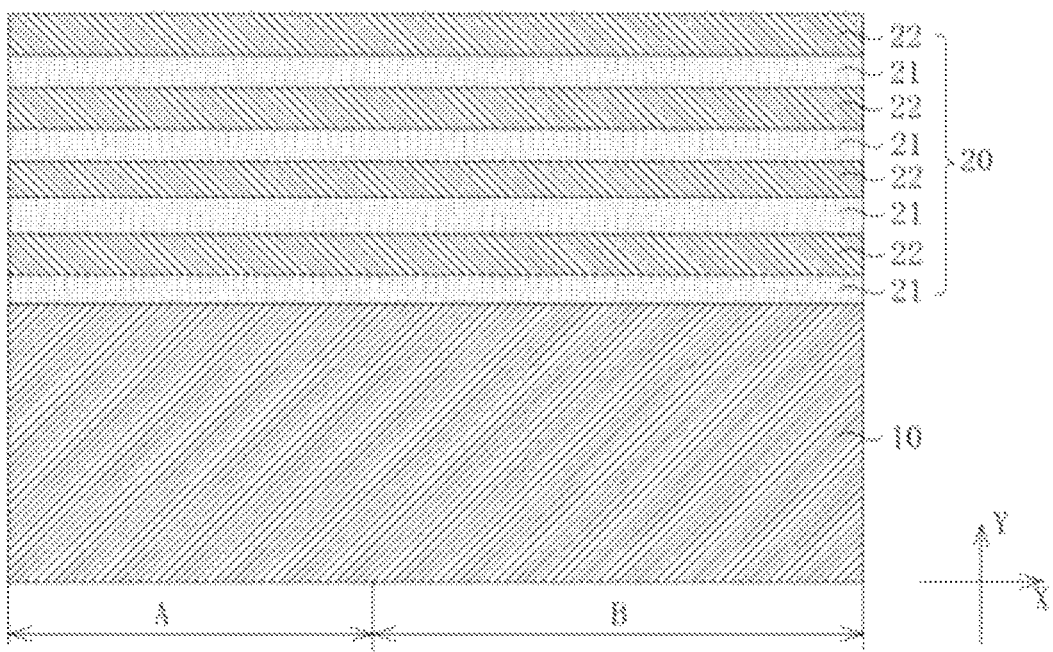
FIG. 3 is a schematic diagram of a first area and a second area alter a film-stack structure is formed according to an embodiment of the disclosure.

Referring to FIG. 3, the substrate 10 may provide a support foundation for structure layers on the substrate 10. A material of the substrate 10 may be semiconductor. For example, the material of the substrate 10 may be monocrystalline silicon, polycrystalline silicon, amorphous silicon, germanium, silicon carbide, Silicon Germanium (SiGe), a Germanium on Insulator (GOI), a Silicon on Insulator (SOI), or the like.

In some possible embodiments, the substrate 10 includes a first area and a second area. The first area is shown at B in FIG. 3, and the second area is shown at A in FIG. 3. The first area is adjacent to the second area. For example, the first area is adjacent to and connected to the second area, A semiconductor device, such as the transistor 2, may be disposed on the first area. A connection structure, such as the connection layer 60 (referring to the figure *), may be disposed on the second area. The semiconductor device in the first area is led out by means of a structure in the second area, to cause the semiconductor device to be electrically connected to the peripheral circuit. The substrate 10 located in the first area and the substrate 10 located in the second area are provided as a whole, so as to facilitate providing the substrate 10.

At S20, a film-stack structure is formed on the substrate, and the film-stack structure includes sacrificial layers and active layers that are alternately stacked in a first direction.

Referring to FIG. 3, the film-stack structure 20 includes a plurality of sacrificial layers 21 and a plurality of active layers 22. The plurality of sacrificial layers 21 and the plurality of active layers 22 are alternately stacked in a first direction. The first direction is a direction parallel to the substrate 10, i.e., the Y direction shown in FIG. 3. In the first direction, an active layer 22 is disposed between the two adjacent sacrificial layers 21, or a sacrificial layer 21 is disposed between two adjacent active layers 22, so that the sacrificial layers 21 and the active layers 22 are alternately disposed. Through such an arrangement, two adjacent active layers 22 may be isolated through a sacrificial layer 21, so as to electrically isolate the active layers 22 in the first direction.

Specifically, the operation of forming the film-stack structure 20 on the substrate 10 includes: alternately repeatedly forming the sacrificial layers 21 and the active layers 22 on the substrate 10, until the film-stack structure 20 is formed. The layer of the film-stack structure 20 closest to the substrate 10 is a sacrificial layer 21, and the layer of the film-stack structure 20 farthest away from the substrate 10 is an active layer 22. Specifically, when the film-stack structure 20 is formed, a sacrificial layer 21 is formed on the substrate 10, then an active layer 22 is formed on the sacrificial layer 21, and then a sacrificial layer 21 is formed on the active layer 22. The process of forming the active layer 22 and the sacrificial layer 21 is repeated, until a required number of the sacrificial layers 21 and the active layers 22 are formed.

As shown in FIG. 3, the layer of the film-stack structure 20 closest to the substrate 10 is a sacrificial layer 21, so that the active layer 22 on the sacrificial layer 21 is isolated from the substrate 10. Each active layer 22 may subsequently form the transistor 2, so that the number of the transistors 2 is increased. Therefore, the storage capacity of a semiconductor structure is increased. The layer of the film-stack structure 20 farthest away from the substrate 10 is the active layer 22. Through such an arrangement, when the film-stack structure 20 has the same number of the active layers 22, a height of the film-stack structure 20 is reduced, so as to facilitate subsequently etching the film stack structure 20.

In some possible implementations, the sacrificial layers 21 and the active layers 22 are formed on the substrate 10 by means of a deposition process. The deposition process may include Chemical Vapor Deposition (CVD), Physical Vapor Deposition (PVD), Atomic Layer Deposition (ALD), or the like.

In some other possible implementations, the sacrificial layers 21 and the active layers 22 are formed from the substrate 10 by, means of an Epitaxy (EPI) growth process. Specifically, the substrate 10, the active layers 22, and the sacrificial layers 21 specifically have a same element, such as silicon, so as to epitaxially grow a sacrificial layer 21 on the substrate 10, epitaxially grow an active layer 22 on the sacrificial layer 21, and epitaxially grow a sacrificial layer 21 on the active layer 22. Exemplarily, the material of the substrate 10 includes the silicon, a material of the active layer 22 includes the silicon, and a material of the sacrificial layers 21 includes germanium silicon. In one aspect, the active layers 22 and the sacrificial layers 21 are formed by epitaxially growing. In the other aspect, since die sacrificial layers 21 and the active layers 22 have a relatively large selection ratio, the sacrificial layers 21 may be separately removed, subsequently, so as to reduce damage to the active layers 22 when removing the sacrificial layers 21. Preferably, the material of the active layers 22 includes doped silicon. For example, the material of the active layers 22 includes N-type doped silicon, to enhance the electrical property of the active layers 22.

At S30, part of the film-stack structure located in a first area is removed, to form plurality of first grooves that are spaced apart from each other and extend in a second direction. The substrate is exposed from the first grooves to divide the active layers located in the first area into a plurality of active pillars that are spaced apart from each other.

Figure 4:
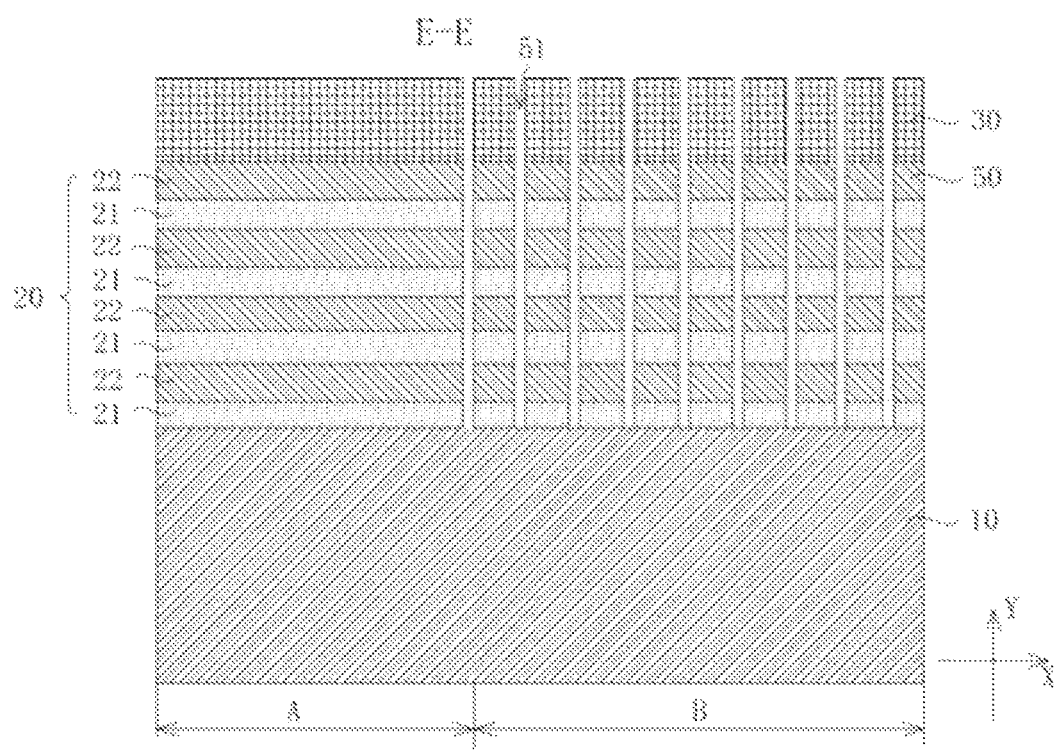
FIG. 4 is a schematic diagram of a first area and a second area after a first move is formed according to an embodiment of the disclosure.

Referring to FIG. 4, the plurality of first grooves 51 are formed in the film-stack structure 20 located in the first area. The plurality of first grooves 51 are spaced apart from each other and extend in the second direction. The second direction is a horizontal direction a (Z direction) shown in FIG. 1, which is parallel to the substrate 10 and perpendicular to the first direction. The first grooves 51 penetrate the film-stack structure 20 located in the first area, to expose the substrate 10.

Figure 5:
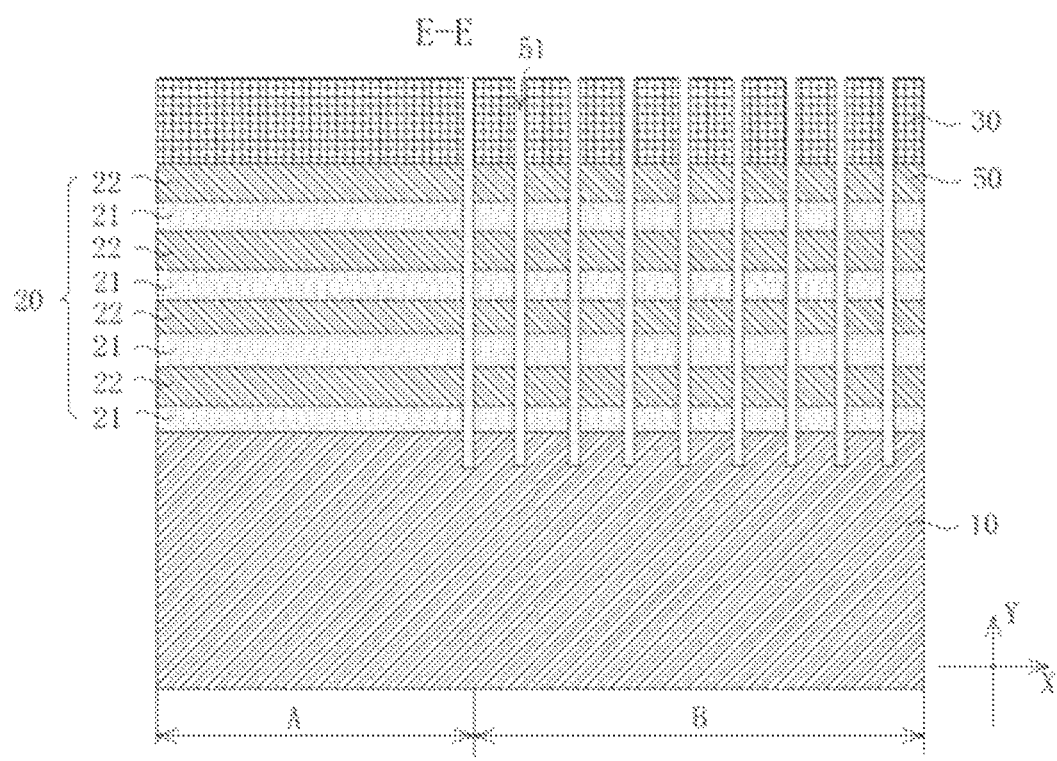
FIG. 5 is another schematic diagram of a first area and a second area after a first groove is formed according to an embodiment of the disclosure.

In some possible embodiments, referring to FIG. 5, the first grooves 51 may extend into the substrate 10. That is to say, bottoms of the first grooves 51 are located in the substrate 10. Through such an arrangement, it can be guaranteed that the first grooves 51 divides the film-stack structure 20 into a plurality of divisions, so that each active layer 22 in the film-stack structure 20 is divided into a plurality of active pillars 50 that are spaced apart from each other.

Therefore, the number of the active pillars 50 is increased, and the storage capacity of the semiconductor structure is increased.

As shown in FIG. 4 and FIG. 5, the plurality of active pillars 50 are arranged in arrays, and extend in the second direction. The plurality of active pillars 50 are spaced in the first direction, and spaced in a third direction. The third direction and the first direction intersect with each other, and are perpendicular to the second direction. The third direction is a direction parallel to the substrate 10. Exemplarily, the third direction is a horizontal direction (X direction) shown in FIG. 4 and FIG. 5. The first direction, the second direction, and the third direction are perpendicular to each other. Through such an arrangement, the active pillars 50 are arranged more compactly, so that the arrangement number of the active pillars 50 is increased to a great extent. The active pillars 50 include source electrodes, drain electrodes, and channels located between the source electrodes and the drain electrodes. The shape of each active pillar 50 may be a cylinder, a prism, a cuboid, or other shape, which is not limited in this embodiment of the disclosure.

Specifically, the operation of removing part of the film-stack structure 20 located in the first area, and forming, the plurality, of first grooves 51 that are spaced apart from each other and extend in the second direction includes: etching the film-stack structure 20 located in the first area to form the first grooves 51, where the first grooves 51 penetrate the film-stack structure 20.

Referring to FIG. 4 to FIG. 7, in some possible implementations, the operation of etching the film-stack structure 20 located in the first area to form the first grooves 51, where the first grooves 51 penetrate the film-stack structure 20, includes the following operation.

A first mask layer 40 is formed on the film-stack structure 20, and the first mask layer 40 located in the first area has a first pattern. The first mask layer 40 is formed on the film-stack structure 20. The first mask layer 40 covers the film-stack structures 20 that are located in the first area and the second area. The first mask layer 40 located in the first area has the first pattern, to expose part of the film-stack structure 20 located in the first area, and the film-stack structure 20 located in the second area is not exposed.

The film-stack structure 20 located in the first area is etched by using the first mask layer 40 as a mask, to form the first grooves 51. By using the first mask layer 40 as the mask to etch the film-stack structure 20, the first pattern is transferred into the film-stack structure 20 located in the first area, so as to form the first grooves 51 in the film-stack structure 20.

Figure 6:
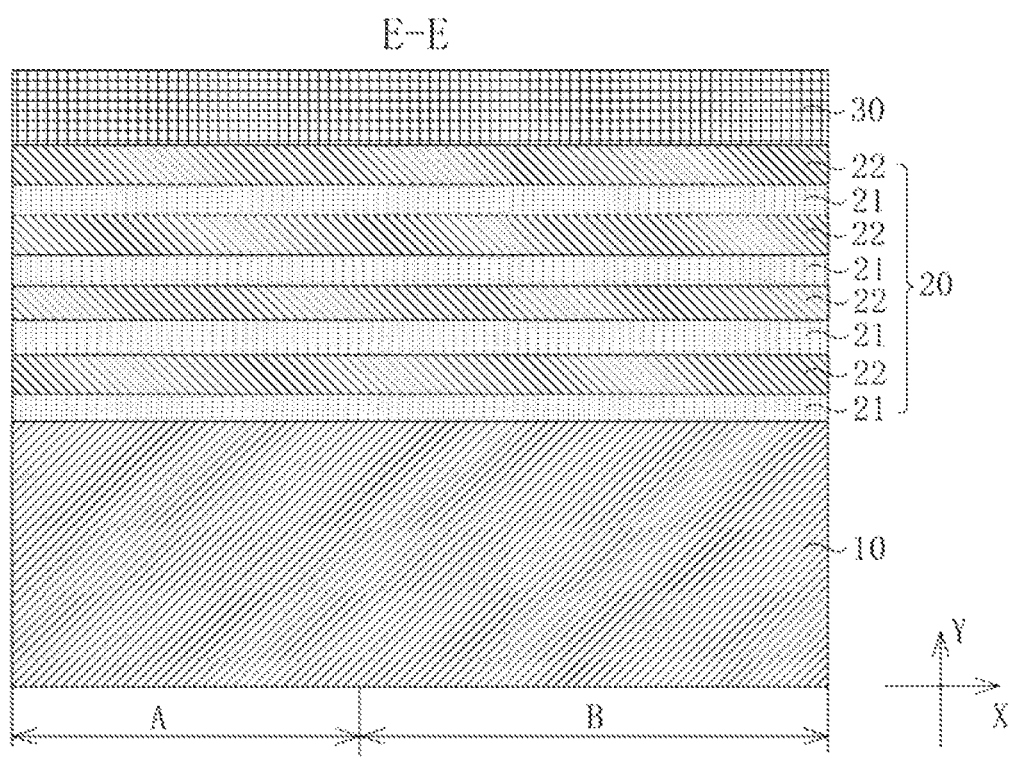
FIG. 6 is a schematic diagram of a first area and a second area after a protective layer is formed according to an embodiment of the disclosure.
Figure 7:
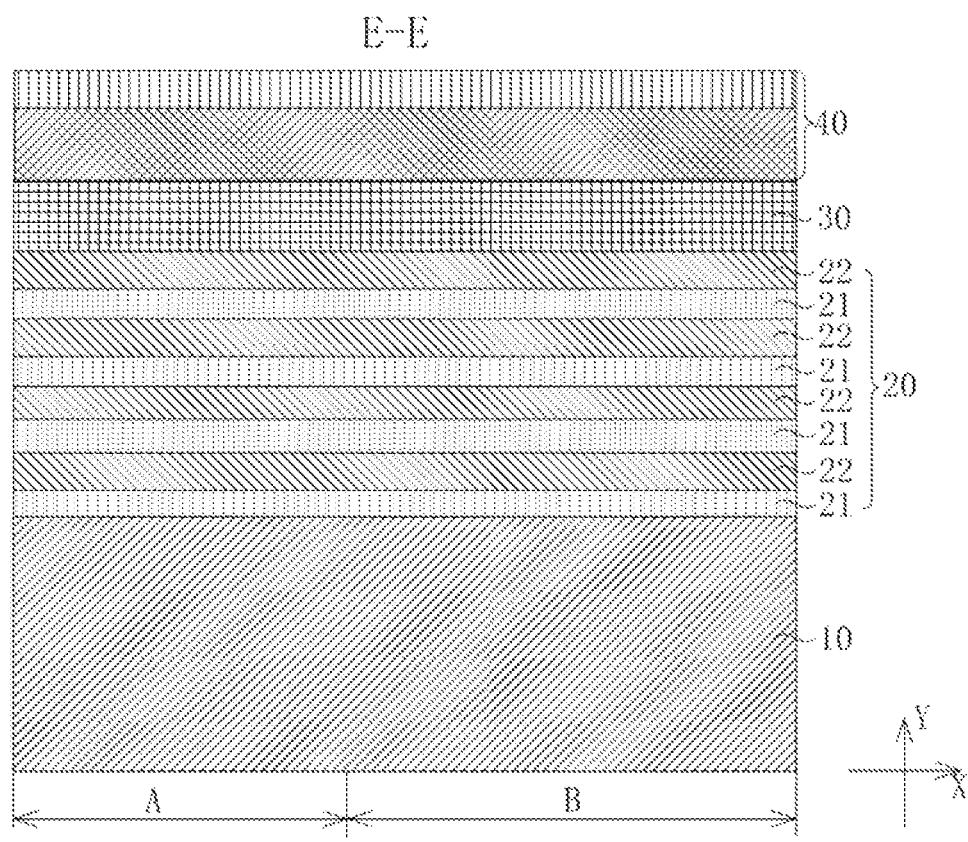
FIG. 7 is a schematic diagram of a first area and a second area after a first mask layer is formed according to an embodiment of the disclosure.

In some other possible implementations, the operation of forming the first mask layer 40 on the film-stack structure 20 includes: forming a protective layer 30 on the film-stack structure 20, and forming the first mask layer 40 on the protective layer 30. Referring to FIG. 4 and FIG. 6, the film-stack structure 20 is covered by the protective layer 30. The protective layer 30 may be a silicon oxide layer, to reduce or prevent oxidation of the active lavers 22. Referring to FIG. 6 and FIG. 7, the protective layer 30 is covered by the first mask layer 40, and the first mask layer 40 located in the first area has the first pattern.

Correspondingly, referring to FIG. 7 and FIG. 5, the operation of etching the film-stack structure 20 located in the first area by using the first mask layer 40 as the mask includes: etching the protective layer 30 located in the first area by using the first mask layer 40 as the mask, to transfer the first pattern into the protective layer 30; and removing the first mask layer 40, and continuing to etch the film-stack structure 20 by using the patterned protective layer 30. That is to say, the first pattern of the first mask layer 40 is first transferred into the protective layer 30 located in the first area. Then the first mask layer 40 is removed to expose the protective layer 30, The patterned protective layer 30 is used as the mask to continue to etch the film-stack structure 20, so as to form the first grooves 51 in the film-stack structure 20.

At S40, the sacrificial layers located in the first area and the second area are removed by using the first grooves, to cause the active pillars located in the first area and the active layers located in the second area to be spaced apart from each other in the first direction. The second area is adjacent to the first area.

Figure 8:
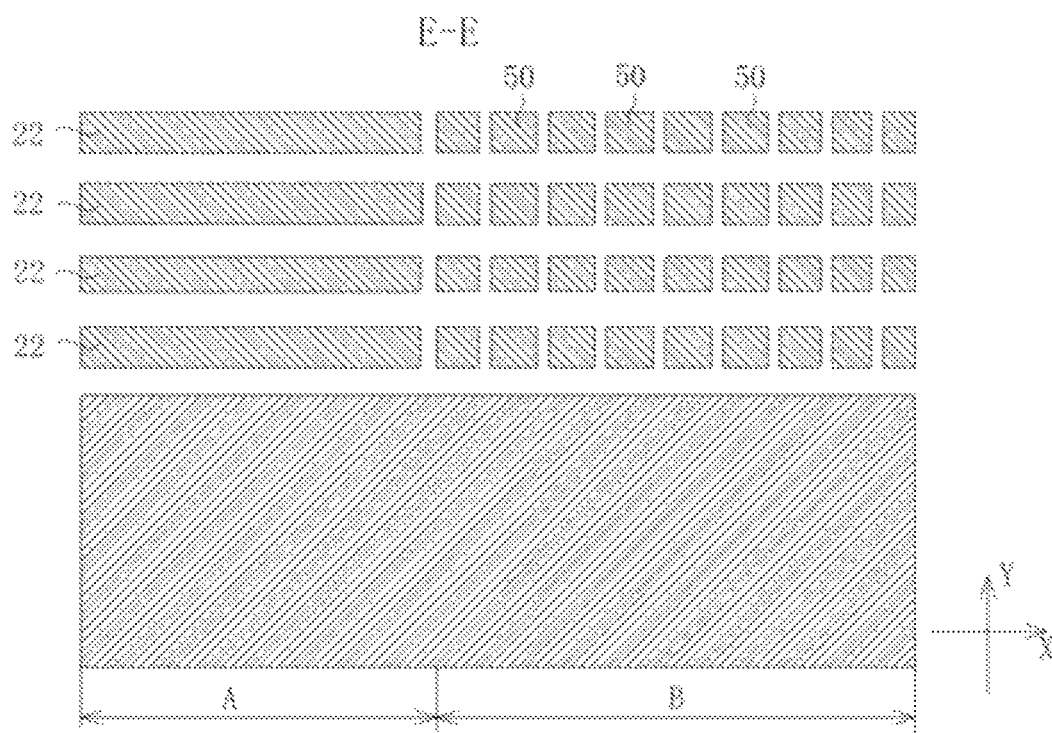
FIG. 8 is a schematic diagram of a first area and a second area after sacrificial layers are removed according to an embodiment of the disclosure.

Referring to FIG. 5 and FIG. 8, the sacrificial layers 21 in the first area and the second area are completely removed. The active pillars 50 located in the first area are spaced apart from each other in the first direction. The active layers 22 located in the second area are spaced in the first direction. In some possible implementations, the operation of removing the sacrificial layers 21 located in the first area and the second area by using the first grooves 51 includes: exposing sidewalls of the sacrificial layers 21 by using the first grooves 51, and removing the sacrificial layers 21 located in the first area and the second area by means of a wet etching process. The wet etching process has a desirable selection ratio. Removing the sacrificial layers 21 by means of wet etching may prevent damage to the exposed active layers 22, the active pillars 50, and the substrate 10.

At S50, part of the active layers located in the second area are removed, to form a plurality of step-shaped connection layers on an end of the second area away from the first area.

Figure 9:
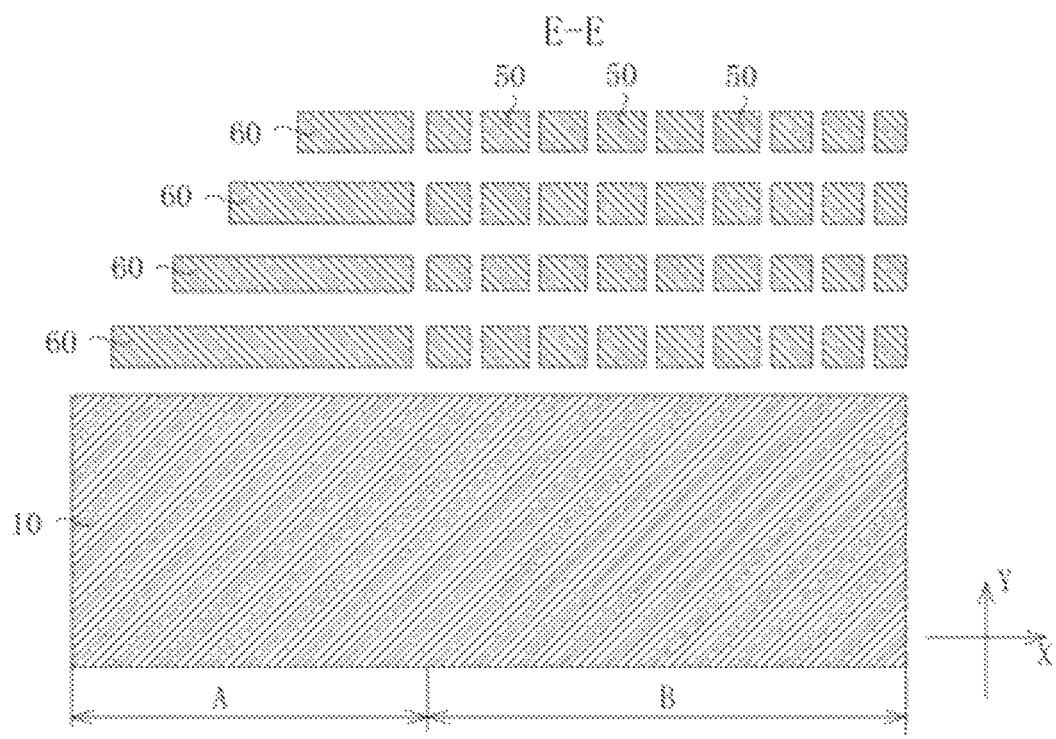
FIG. 9 is a schematic diagram of a first area and a second area after connection layer are formed according to an embodiment of the disclosure.

Referring to FIG. 9, part of the active layers 22 located in the second area is removed. The rest of the active layers 22 located in the second area form the connection layer 60. In a direction away from the substrate 10, lengths of the plurality of connection layers 60 are successively decreased, so that ends of the plurality of connection layers 60 away from the first area are in a step shape. As shown in FIG. 9, the step shape goes upward in the first direction and goes upward in the third direction. The first direction is a direction perpendicular to the substrate 10, which is the Y direction shown in FIG. 9. The third direction is a direction parallel to the substrate 10, which is the X direction shown in FIG. 9. Partial surface of each connection layer 60 is exposed, so as to form other structures on the connection layers 60. Specifically, in a surface of each connection layer 60 facing away from the substrate 10, partial surface away from the first area is exposed. That is to say, a left end in an upper surface of each connection layer 60 is exposed.

In some possible embodiments, the operation of removing the part of the active layers 22 located in the second area, to form the plurality of step-shaped connection layers 60 on the end of the second area away from the first area includes: forming second mask layers, each on a respective one of the active layers 22, where the second mask layers located in the second area have a second pattern; and etching each of the active layers 22 located in the second area by using a respective one of the second masks layers as a mask, to form the plurality of step-shaped connection layers 60 on the end of the second area away from the first area; and removing the second mask layers.

In the above embodiment, each active layer 22 corresponds to a second mask layer with a different size. The required connection layers 60 are formed by gradually narrowing the second mask layers and etching to the corresponding active layers 22. Specifically, the second mask layers are first formed on the active layers 22, and used as a mask to etch to the lowest active layer 22, to cause the lowest active layer 22 to be formed as the a connection layer 60; then, parts of the second mask layers away from the first area are removed, and the remaining parts of the second mask layers are used as a mask to etch to the penultimate active layer 22, to cause the penultimate active layer 22 to be formed as a connection layer 60; . . . ; and so on, until the topmost active layer 22 is formed as a connection layer 60. The lowest layer is a layer in the active layer 22 closest to the substrate 10. The topmost layer is a layer in the active layer 22 farthest away from the substrate 10.

At S60, gate material layers are formed to cover the connection layers and the active pillars on each of a plurality of horizontal levels. On the connection layer and the active pillars located on a same one of the horizontal levels, the formed gate material layers connect with each other; and on the connection layers and the active pillars located on different ones of the horizontal levels, the formed gate material layers are isolated from each other.

Figure 10:
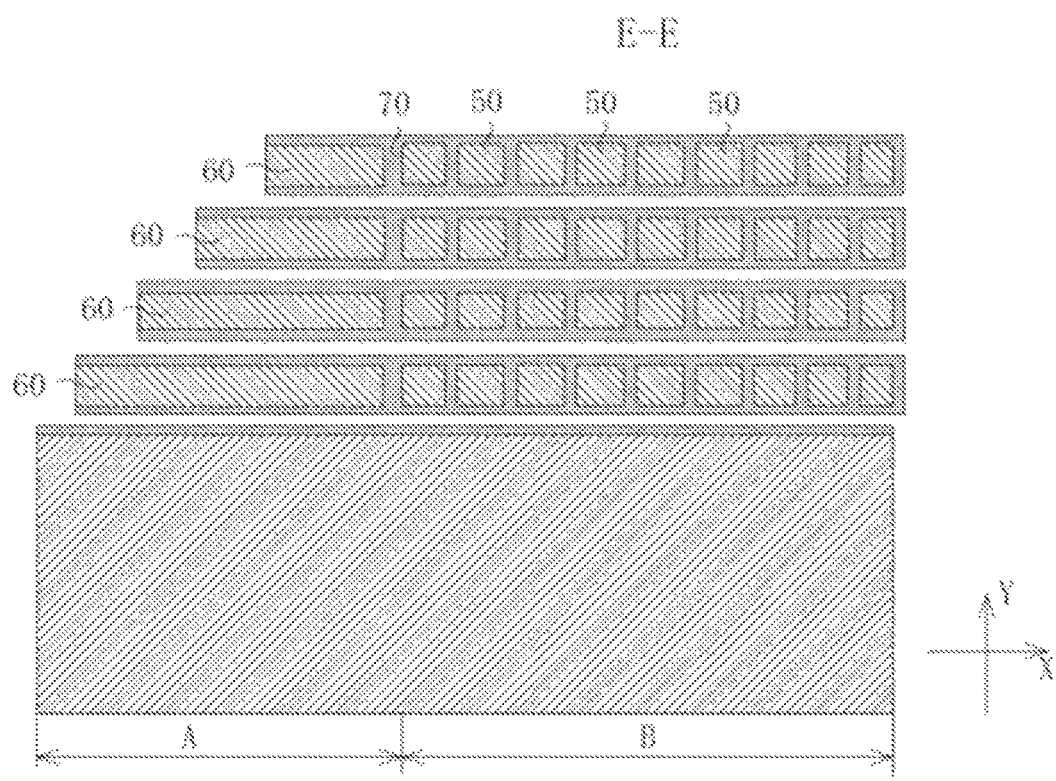
FIG. 10 is a schematic diagram of a first area and a second area after gate material layers are formed according to an embodiment of the disclosure.

Referring to FIG. 10, after the gate material layers 70 are formed, an the connection layer 60 and the active pillars 50 located on a same one of the horizontal levels, the formed gate material layers 70 connect with each other; and on the connection layers 60 and the active pillars located on different ones of the horizontal levels, the formed gate material layers 70 are isolated from each other. In this way, the gate material layers 70 are electrically isolated in the first direction. The plurality of gate material layers 70 are in a step shape, and lengths of the gate material layers vary in steps. Specifically, in the direction away from the substrate 10, the lengths of the gate material layers 70 are gradually decreased.

Each gate material layer 70 includes a gate dielectric layer and a gate conductive layer. The gate dielectric layer covers a peripheral surface of the active pillars 50. The gate conductive layer covers a peripheral surface of the gate dielectric layer and is integrally formed in the second direction. Part of the gate conductive layer may be used as a gate electrode of the transistor 2. As shown in FIG. 10, the gate conductive layer further extends to the connection layer 60, and at least covers two surfaces of the connection layer 60 that are opposite to each other in the first direction. The gate dielectric layer way be disposed between the gate conductive layer and the connection layer 60, so that the connection layer 60 and the gate dielectric layer on the active pillars 50 are formed together. Therefore, the gate dielectric layer is conveniently manufactured. A material of the gate dielectric layer may be silicon oxide, and a material of the gate conductive layer may be titanium nitride. The gate conductive layers act as the WLs 4, so that the WLs 4 are easy to manufacture and lead out.

In some possible embodiments, the operation of forming the gate material layers 70 to cover the connection layers 60 and the active pillars 50 includes the following operation.

The gate dielectric layers are formed to cover surfaces of the connection layers 60 and the active pillars 50, and there is a gap between the gate dielectric layers on the surfaces of the connection layers 60 and the active pillars 50. Exemplarily, the gate dielectric layers are deposited on the surfaces of the connection layers 60 and the active pillars 50. The gate dielectric layers covers the peripheral surface of the active pillars 50, and at least cover two surfaces of the connection layers 60 that are opposite to each other in the first direction and a surface facing an active pillars 50. In the embodiment that an active pillar 50 includes a source electrode, a channel, and a drain electrode, the gate dielectric layer is opposite to the channel.

A gate conductive layer is deposited to cover surfaces of a gate dielectric layer. The gate conductive layers on the gate dielectric layers disposed at a same horizontal level connect with each other, and the gate conductive layers on the gate dielectric layers disposed at different horizontal levels are isolated from each other. That is to say, a plurality of gate conductive layers are formed. The plurality of gate conductive layers are spaced apart from each other in the first direction. Each gate conductive layer covers the surfaces of the gate dielectric layer disposed at the same horizontal level and is filled between the gate dielectric layers. The gate conductive layers are formed as WLs 4. Each gate conductive layer located in the first area acts as a gate electrode, and the gate electrode is a part of the WL 4. The gate conductive layer located in the second area acts as a leading-out end of the gate, so as to be connected to a peripheral circuit.

It is to be noted that, while the gate material layers 70 are formed to cover the connection layers 60 and the active pillars 50, the method further includes: forming the gate material layers 70 on the substrate 10 located in the first area and the second area. The gate material layer 70 on the substrate 10 is isolated from the gate material layers 70 on the active pillars 50 and the gate material layers 70 on the connection layers 60. As shown in FIG. 10, there is a gap between the active pillars 50 located in the first area and the substrate 10, and there is a gap between the connection layers 60 located in the second area and the substrate 10. Therefore, when the gate material layers 70 are deposited, the gate material layers 70 also cover the substrate 10 located in the first area and the second area. The gate material layer 70 on the substrate 10 is spaced apart from the gate material layers 70 on the active pillars 50, and spaced apart from the gate material layers 70 on the connection layers 60, so as to cause each gate material layer 70 to be isolated from one another.

In some possible embodiments, after the step (S60) that the gate material layers 70 are formed to cover the connection layers 60 and the active pillars 50 on each of a plurality of horizontal levels, on the connection layer 60 and the active pillars 50 located on a same one of the horizontal levels, the formed gate material layers 70 connect with each other; and on the connection layers 60 and the active pillars 50 located on different ones of the horizontal levels, the formed gate material layers 70 are isolated from each other, the method further includes: forming, a plurality of contact plugs 80 that are spaced apart from each other and extend in the first direction. Each contact ping 60 is in contact with a respective gate material layer 70 located in the second area.

Figure 11:
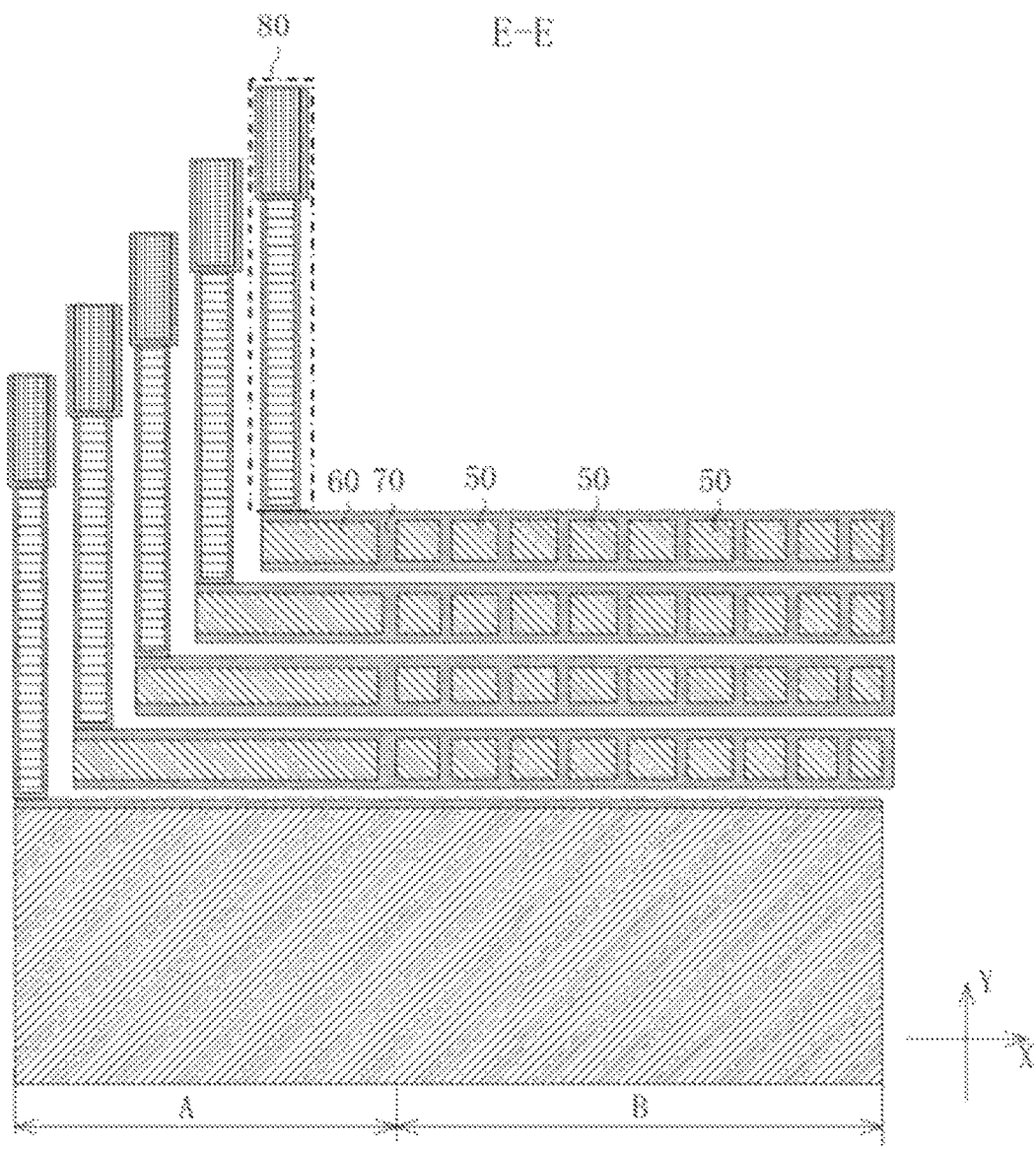
FIG. 11 is a schematic diagram of a first area and a second area after contact plugs are formed according to an embodiment of the disclosure.

Referring to FIG. 11, the plurality of contact plugs 60 are configured to connect the gate material layers 70 to the peripheral circuit. The plurality of contact plugs 80 are spaced apart from each other, to guarantee insulated isolation of the plurality of contact plugs 80. Therefore, mutual interference between the gate material layers 70 is avoided. Each of the plurality of contact plugs 80 corresponds to and is in contact with a respective one of the plurality of gate material layers 70. Therefore, each gate material layer 70 may be electrically connected to the peripheral circuit, and control the transistor 2 corresponding to the gate material layer 70 by using the peripheral circuit.

Each contact plug 80 may include a first conductive portion and a second conductive portion disposed on the first conductive portion. The first conductive portion is a portion close to the substrate 10, and the second conductive portion is a portion away from the substrate 10. That is to say, the second conductive portion is located on a side of the first conductive portion away from the substrate 10. Each of the first conductive portion and the second conductive portion may include a core layer and an outer layer covering side surface and a bottom surface of the core layer. The core layer may be an insulation layer, and a material of the core layer may be silicon nitride or silicon oxide. The outer layer may be a metal layer, and a material of the outer layer may be tungsten or titanium nitride. Through such an arrangement, on the basis of guaranteeing the electric performance of the first conductive portion and the second conductive portion, thicknesses of the metal layers are decreased, so as to reduce costs.

It is to be noted that, in this embodiment of the disclosure, the substrate 10 farther has a third area. The third area is adjacent to the first area, and is shown at C in FIG. 11. The capacitor 3 may be formed on the third area. The capacitor 3 is generally manufactured after the gate material layers 70 are formed.

Figure 12:
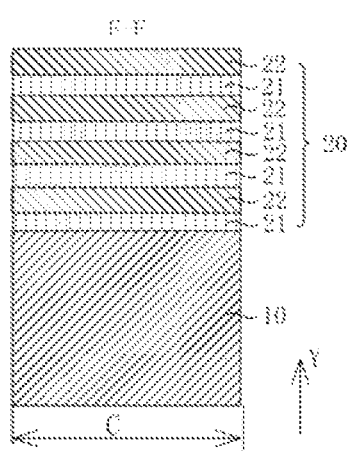
FIG. 12 is a schematic diagram of a third area after a film-stack structure is formed according to an embodiment of the disclosure.

Specifically, referring to FIG. 12, when the film-stack structure 20 is formed on the substrate 10, and the film-stack structure 20 includes sacrificial layers 21 and active layers 22 that are alternately stacked in the first direction, the film-stack structures 20 is formed on all of the first area, the second area, and the third area of the substrate 10. The film-stack structure 20 located in the first area subsequently is formed as the active pillars 50. The film-stack structure 20 located in the second area subsequently is formed as the connection layers 60. The film-stack structure 20 located in the third area subsequently is formed as support layers of the capacitor 3.

Figure 13:
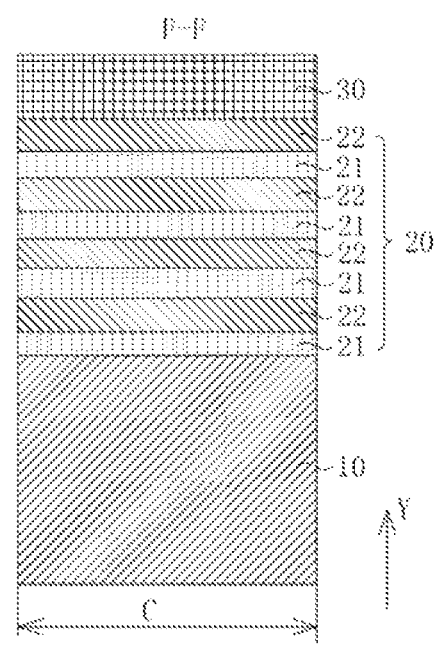
FIG. 13 is a schematic diagram of a third area after a protective layer is formed according to an embodiment of the disclosure.
Figure 14:
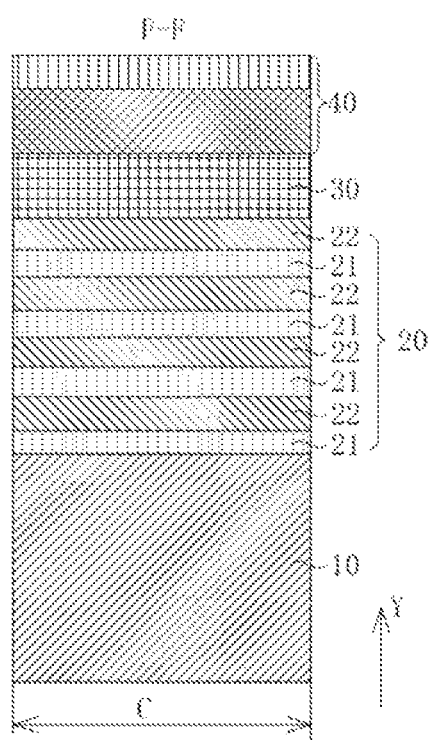
FIG. 14 is a schematic diagram of a third area after a first mask layer is formed according to an embodiment of the disclosure.

Referring to FIG. 13 and FIG. 14, when the protective layer 30 is formed on the film-stack structure 20 and the first mask layer 40 is formed on the protective layer 30, the protective layer 30 and the first mask layer 40 are formed on the film-stack structures 20 located in the first area, the second area, and the third area. In a subsequent manufacturing process, the protective layer 30 and the first mask layer 40 located in the third area retain all the time, until the gate material layers 70 are formed. Through such an arrangement, the active layers 22 in the third area are prevented from being damaged during the manufacturing of the WLs 4.

To sum up, in the method for manufacturing a memory device according to this embodiment of the disclosure, a film-stack structure 20 is formed on a substrate 10 and includes sacrificial layers 21 and active layers 22 that are alternately stacked in the first direction. The sacrificial layers 21 and the part of the active layers 22 are removed, to cause the active layers 22 located in the first area to be formed as a plurality of active pillars 50 that are spaced apart from each other and the active layers 22 located in the second area to be formed as a plurality of step-shaped connection layers 60. Then, the gate material lavers 70 are formed on the connection layers 60 and the active pillars 50 on each of a plurality of horizontal levels. On the connection layer 60 and the active pillars 50 located on a same one of the horizontal levels, the formed gate material layers 70 connect with each other; and on the connection layers 60 and the active pillars 50 located on different ones of the horizontal levels, the formed gate material layers 70 are isolated from each other. The gate material layers 70 acts as the WLs 4. By disposing the connection layers 60, it is convenient to manufacture the WLs 4 and lead out the WLs 4. In addition, since the ends of the plurality of connection lavers 60 away from the first area are in a step shape, ends of the gate material layers 70 covering the active pillars 50 and the connection layers 60 away from the first area are also in a step shape. That is to say, the WLs 4 are in a step shape. In this way, other structures are conveniently manufactured on the WLs 4, so as to achieve electrical connection between the WLs 4 and a peripheral circuit.

A second aspect of the disclosure provides a memory device. Referring to FIG. 1 and FIG. 11, the memory device has a first area and a second area. The first area is shown at B in FIG. 11, and the second area is shown at A in FIG. 11. The first area is adjacent to the second area. For example, the first area is adjacent to and connected to the second area. A semiconductor device, such as the transistor 2, may be disposed on the first area. A connection structure, such as the connection layers 60, may be disposed on the second area. The semiconductor device on the first area is led out by means of a structure on the second area, to cause the semiconductor device to be electrically connected to the peripheral circuit. The memory device includes: a plurality of connection layers 60, located in the second area and spaced apart from each other in a first direction. Ends of the plurality of connection layers 60 away from the first area are in a step shape.

Referring to FIG. 11, the plurality of connection layers 60 are located in the second area, and are stacked in the first direction. The plurality of connection layers 60 are spaced apart from each other, to guarantee electrical isolation of the plurality of connection layers 60. The ends of the plurality of connection layers 60 away from the first area are formed into steps. As shown in FIG. 11, left ends of the plurality of connection layers 60 are in a step shape. Specifically, the step shape goes upward in the first direction and goes upward in the third direction. The first direction is a direction perpendicular to the substrate 10, which is the Y direction shown in FIG. 11. The third direction is a direction parallel to the substrate 10, which is the X direction shown in FIG. 11.

In some possible examples, referring to FIG. 11, in a direction away from the substrate 10, lengths of the plurality of connection layers 60 are successively decreased, so that ends of the plurality of connection layers 60 away from the first area are in a step shape. As shown in FIG. 11, partial surface of each connection layer 60 is exposed, so as to form other structures on the connection layer 60. Specifically, partial surface, away from the first area, in a surface of each connection layer 60 facing away from the substrate 10 is exposed.

Continuously referring to FIG. 11, the memory device further includes: a plurality of active pillar layers, located in the first area and spaced apart from each other in the first direction. Each active pillar layer is disposed at a same horizontal level with a respective connection layer 60. Each active pillar layer has a plurality of active pillars 50 that are spaced apart from each other, and each active pillar 50 extends in a second direction.

As shown in FIG. 11, the plurality of active pillar layers are located in the first area, and are stacked in the first direction. The plurality of active pillars 50 are spaced apart front each other, to guarantee electrical isolation of the plurality of active pillar layers. The plurality of active pillar layers are in one-to-one correspondence with the plurality of connection layers 60. An active pillar layer and a connection layers 60 corresponding to each other are disposed at the same horizontal level, so as to form a gate material layer 70 on the active pillar layer and the connection layer 60.

As shown in FIG. 11, each active pillar layer includes a plurality of active pillars 50 that are spaced apart from each other. The plurality of active pillars 50 extend in the second direction. The plurality of active pillars 50 are arranged in arrays. Specifically, the plurality of active pillars 50 are spaced in the first direction, and spaced in a third direction. The third direction and the first direction intersect with each other, and are perpendicular to the second direction. The second direction is a direction parallel to the substrate 10. Exemplarily, the second direction is a horizontal direction (Z direction) shown in FIG. 1. The first direction, the second direction, and the third direction are perpendicular to each other. Through such an arrangement, the active pillars 50 are arranged more compactly, so that the arrangement number of the active pillars 50 is increased to a great extent. The shape of each active pillar 50 may be a cylinder, a prism, a cuboid, or other shape, which is not limited in this embodiment of the disclosure.

Continuing to refer to FIG. 11, the memory device further includes: gate material layers 70, located on the connection layers 60 and the active pillars 50 on each of a plurality of horizontal levels. On the connection layer 60 and the active pillars 50 located on a same one of the horizontal levels, the formed gate material layers 70 connect with each other; and on the connection layers 60 and the active pillars 50 located on different ones of the horizontal levels, the formed gate material layers 70 are isolated from each other.

As shown FIG. 11, n the connection layer 60 and the active pillars 50 located on a same one of the horizontal levels, the formed gate material layers 70 connect with each other; and on the connection layers 60 and the active pillars 50 located on different ones of the horizontal levels, the formed gate material layers 70 are isolated from each other. In this way, the gate material layers 70 are electrically isolated in the first direction. Since the connection layers 60 are in a step shape, the plurality of gate material layers 70 are in a step shape, and lengths of the gate material layers vary in steps. In this way, other structures are formed on the gate material layers 70, so as to lead out the gate material layers 70. Specifically, in the direction away from the substrate 10, the lengths of the gate material layers 70 are gradually decreased.

Each gate material layer 70 includes a gate dielectric layer and a gate conductive layer. The gate dielectric layer covers a peripheral surface of the active pillars 50. The gate conductive layer covers a peripheral surface of the gate dielectric layer and is integrally formed in the second direction. Part of the gate conductive layer may be used as a gate electrode of the transistor 2. As shown in FIG. 11, the gate conductive layer further extends to the connection layer 60, and at least covers two surfaces of the connection layer 60 that are opposite to each other in the first direction. The gate dielectric layer may be disposed between the gate conductive layer and the connection layer 60, so that the connection layer 60 and the gate dielectric layer on the active pillar 50 are formed together. Therefore, the gate dielectric layer is conveniently manufactured. The material of the gate dielectric layer may be silicon oxide, and the material of the gate conductive layer may be titanium nitride. The gate conductive layers act as the WLs 4, so that the WLs 4 are easy to manufacture and lead out.

In some possible embodiments, the memory device further includes: a plurality of contact plugs 80, spaced apart from each other and extending in the first direction. Each contact plug 80 is in contact with a respective gate material layer 70 located in the second area.

Specifically, referring to FIG. 11, the plurality of contact plugs 80 are configured to connect the gate material layers 70 to the peripheral circuit. The plurality of contact plugs 80 are spaced apart from each other, to guarantee insulated isolation of the plurality of contact plugs 80. Therefore, mutual interference between the gate material layers 70 is avoided. The plurality of contact plugs 80 are in one-to-one correspondence with and in contact with the plurality of gate material layers 70. Therefore, each gate material layer 70 may be electrically connected to the peripheral circuit, and controls the transistor 2 corresponding to the gate material layer 70 by using the peripheral circuit.

Each contact plug 80 may include a first conductive portion and a second conductive portion disposed on the first conductive portion. The first conductive portion is a portion close to the substrate 10, and the second conductive portion is a portion away from the substrate 10. That is to say, the second conductive portion is located on a side of the first conductive portion away from the substrate 10. Each of the first conductive portion and the second conductive portion may include a core layer and an outer layer covering side surfaces and a bottom surface of the core layer. The core layer may be an insulation layer, and a material of the core layer may be silicon nitride or silicon oxide. The outer layer may be a metal layer, and a material of the outer layer may be tungsten or titanium nitride. Through such an arrangement, on the basis of guaranteeing the electric performance of the first conductive portion and the second conductive portion, thicknesses of the metal layers are decreased, so as to reduce costs.

In some possible embodiments, the memory device further has a third area. The third area is adjacent to the first area. The memory device further includes: a plurality of capacitors 3, spaced apart from each other and located in the third area. The capacitors 3 extend in the second direction, and each capacitor 3 is electrically connected to a respective active pillar 50. Specifically, the third area and the first area may be arranged in the second direction (a Z direction shown in FIG. 11). The plurality of capacitors 3 that are spaced apart from each other are disposed in the third area. The plurality of capacitors 3 are in one-to-one correspondence and electrically connected to the plurality of active pillars 50.

According to the memory device provided in this embodiment of the disclosure, the gate material layers 70 are disposed on the connection layers 60 and the active pillars 50 on each of a plurality of horizontal levels. On the connection layer 60 and the active pillars 50 located on a same one of the horizontal levels, the formed gate material layers 70 connect with each other; and on the connection layers 60 and the active pillars 50 located on different ones of the horizontal levels, the formed gate material layers 70 are isolated from each other. The gate material layers 70 act as the WLs 4. By disposing the connection layers 60, it is convenient to manufacture the WLs 4 and lead out the WLs 4. In addition, since the ends of the plurality of connection layers 60 away from the first area are in a step shape, ends of the gate material layers 70 covering the active pillars 50 and the connection layer 60 away from the first area are also in a step shape. That is to say, the WLs 4 is in a step shape. In this way, other structures are conveniently manufactured on the WLs 4, so as to achieve electrical connection between the WLs 4 and a peripheral circuit.

The embodiments or implementations in this specification are described in a progressive manner. Each embodiment focuses on the differences from other embodiments, and the same and similar parts of the various embodiments may be referred to each other. Descriptions of the terms "an embodiment," "some embodiments," "exemplary implementation," "example," "specific example," or "some examples", mean that specific features, structures, materials, or characteristics described with reference to the implementations or examples are included in at least one implementation or example of the disclosure. In this specification, schematic representations of the above terms do not necessarily refer to the same implementation or example. In addition, the described particular features, structures, materials or characteristics may be combined in any suitable manner in any one or more implementations or examples.

It is to be noted at last: the above various embodiments are only used to illustrate the technical solutions of the disclosure and not used to limit the same. Although the disclosure has been described in detail with reference to the foregoing embodiments, for those of ordinary skill in the art, they can still modify the technical solutions described in the foregoing embodiments, or equivalently replace part or all of the technical features; all these modifications and replacements shall not cause the essence of the corresponding technical solutions to depart from the scope of the technical solutions of the embodiments of the disclosure.

The invention claimed is:

1. A method for manufacturing a memory device, comprising:
   providing a substrate;
   forming a film-stack structure on the substrate, wherein the film-stack structure comprises sacrificial layers and active layers that are alternately stacked in a first direction;
   removing part of the film-stack structure located in a first area, to form a plurality of first grooves that are spaced apart from each other and extend in a second direction, wherein the substrate is exposed from the first grooves, to divide the active layers located in the first area into a plurality of active divisions that are spaced apart from each other;
   removing the sacrificial layers located in the first area and the second area by using the first grooves, to cause the active divisions located in the first area and the active layers located in the second area to be spaced apart from each other in the first direction, wherein the second area is adjacent to the first area;
   removing part of the active layers located in the second area, to form a plurality of step-shaped connection layers on an end of the second area away from the first area; and
   forming gate material layers to cover the connection layers and the active divisions on each of a plurality of horizontal levels, wherein on the connection layer and the active divisions located on a same one of the horizontal levels, the formed gate material layers connect with each other; and on the connection layer and the active divisions located on different ones of the horizontal levels, the formed gate material layers are isolated from each other.

2. The method of claim 1, wherein, in a direction away from the substrate, lengths of the plurality of connection layers are decreased in sequence, to cause ends of the plurality of connection layers away from the first area to be in a step shape.

3. The method of claim 1, wherein the forming the film-stack structure on the substrate comprises:
   alternately repeatedly forming the sacrificial layers and the active layers on the substrate, until the film-stack stricture is formed, wherein a layer of the film-stack structure closest to the substrate is a sacrificial layer, and a layer of the film-stack structure farthest away from the substrate is an active layer.

4. The method of claim 1, wherein the sacrificial layers and the active layers are formed from the substrate by means of an epitaxy growth process.

5. The method of claim 4, wherein a material of the active layers comprises N-type doped silicon, and a material of the sacrificial layers comprises germanium silicon.

6. The method of claim 1, wherein the removing part of the film-stack structure located in the first area, to form a plurality of first grooves that are spaced apart from each other and extend in the second direction, comprises:
etching the film-stack structure located in the first area to form the first grooves, the first grooves penetrating the film-stack structure.

7. The method of claim 6, wherein the etching the film-stack structure located in the first area to form the first grooves, comprises:
forming a first mask layer on the film-stack structure, wherein the first mask layer located in the first area has a first pattern; and
etching the film-stack structure located in the first area by using the first mask layer as a mask, to form the first grooves.

8. The method of claim 7, wherein the removing the sacrificial layers located in the first area and the second area by using the first grooves comprises:
exposing sidewalls of the sacrificial layers by using the first grooves, and removing the sacrificial layers located in the first area and the second area by means of a wet etching process.

9. The method of claim 7, wherein the forming the first mask layer on the film-stack structure comprises:
forming a protective layer on the film-stack structure, and forming the first mask layer on the protective layer.

10. The method of claim 9, wherein the etching the film-stack structure located in the first area by using the first mask layer as the mask comprises:
etching the protective layer located in the first area by using the first mask layer as the mask, to transfer the first pattern into the protective layer; and
removing the first mask layer, and continuing to etch the film-stack structure by using the patterned protective layer.

11. The method of claim 1, wherein the removing part of the active layers located in the second area, to form the plurality of step-shaped connection layers on the end of the second area away from the first area, comprises:
forming second mask layers, each on a respective one of the active layers, wherein the second mask layers located in the second area has a second pattern; and
etching each of the active layers located in the second area by using a respective one of the second mask layers as a mask, to form the plurality of step-shaped connection layers on the end of the second area away from the first area; and
removing the second mask layers.

12. The method of claim 1, wherein the forming gate material layers to cover the connection layers and the active divisions comprises:
forming gate dielectric layers to cover surfaces of the connection layers and the active divisions, wherein there is a gap between the gate dielectric layers on the surfaces of the connection layers and the active divisions; and
depositing gate conductive layers to cover surfaces of the gate dielectric layers.

13. The method of claim 12, wherein the gate conductive layers on the gate dielectric layers disposed at a same horizontal plane connect with each other, and the gate conductive layers on the gate dielectric layers disposed at different horizontal planes are isolated from each other.

14. The method of claim 12, wherein when forming the gate material layers to cover the connection layers and the active divisions, the manufacturing method further comprises:
forming a gate material layer on the substrate located in the first area and the second area, wherein the gate material layer on the substrate, the gate material layers on the active divisions, and the gate material layers on the connection layers are isolated from each other.

15. The method of claim 1, wherein after forming gate material layers to cover the connection layers and the active divisions, and the method further comprises:
forming a plurality of contact plugs that are spaced apart from each other and extend in the first direction, wherein each of the contact plugs is in contact with a respective one of gate material layers located in the second area.

16. A memory device, having a first area and a second area that are adjacent to each other, and comprising:
a plurality of connection layers, located in the second area and spaced apart from each other in a first direction, wherein ends of the plurality of connection layers away from the first area are in a step shape;
a plurality of active division layers, located in the first area and spaced apart from each other in the first direction, wherein each of the active division layers is disposed at a same horizontal level with a respective one of the connection layers; each of the active division layers has a plurality of active divisions pillar that are spaced apart from each other, and each of the active divisions extends in a second direction;
gate material layers, located on the connection layers and the active divisions on each of a plurality of horizontal levels, wherein on the connection layer and the active divisions located on a same one of the horizontal levels, the formed gate material layers connect with each other; and on the connection layer and the active divisions located on different ones of the horizontal levels, the formed gate material layers are isolated from each other;
a third area, wherein the third area is adjacent to the first area; and
a plurality of capacitors, spaced apart from each other and located in the third area, wherein the capacitors extend in the second direction, and each of the capacitors is electrically connected to a respective one of the active divisions.

17. The memory device of claim 16, further comprising:
a plurality of contact plugs, spaced apart from each other and extending in the first direction, wherein each of the contact plugs is in contact with a respective one of the gate material layers located in the second area.

* * * * *